(12) United States Patent
Lu

(10) Patent No.: US 11,508,765 B2
(45) Date of Patent: Nov. 22, 2022

(54) ACTIVE PIXEL SENSING CIRCUIT STRUCTURE AND ACTIVE PIXEL SENSOR, DISPLAY PANEL AND DISPLAY DEVICE

(71) Applicant: Shanghai AVIC OPTO Electronics Co., Ltd, Shanghai (CN)

(72) Inventor: Feng Lu, Shanghai (CN)

(73) Assignee: SHANGHAI AVIC OPTO ELECTRONICS CO., LTD, Shanghai (CN)

( * ) Notice: Subject to any disclaimer, the term of this patent is extended or adjusted under 35 U.S.C. 154(b) by 526 days.

(21) Appl. No.: 16/730,869

(22) Filed: Dec. 30, 2019

(65) Prior Publication Data

US 2021/0066364 A1 Mar. 4, 2021

(30) Foreign Application Priority Data

Aug. 30, 2019 (CN) .......................... 201910815777.6

(51) Int. Cl.
*H01L 27/146* (2006.01)

(52) U.S. Cl.
CPC .. *H01L 27/14612* (2013.01); *H01L 27/14603* (2013.01); *H01L 27/14636* (2013.01); *H01L 27/14643* (2013.01)

(58) Field of Classification Search
None
See application file for complete search history.

(56) References Cited

U.S. PATENT DOCUMENTS

| 10,165,206 | B2* | 12/2018 | Yamada | H01L 27/14603 |
| 10,419,695 | B2* | 9/2019 | Sasago | G06T 7/55 |
| 2003/0002093 | A1* | 1/2003 | Hynecek | H04N 5/3653 |
| | | | | 348/E3.021 |
| 2016/0035772 | A1* | 2/2016 | Yamashita | H01L 27/14627 |
| | | | | 257/432 |
| 2018/0012928 | A1* | 1/2018 | Tsuboi | H01L 27/14609 |
| 2018/0249104 | A1* | 8/2018 | Sasago | H04N 5/3745 |
| 2021/0066364 | A1* | 3/2021 | Lu | H01L 27/14643 |

FOREIGN PATENT DOCUMENTS

| CN | 109375832 A |   | 2/2019 |   |
| CN | 108987455 B | * | 1/2021 | ........... G06K 9/0004 |

* cited by examiner

*Primary Examiner* — Steven M Christopher
(74) *Attorney, Agent, or Firm* — Christensen O'Connor Johnson Kindness PLLC

(57) ABSTRACT

The present disclosure provides an active pixel sensing circuit structure, an active pixel sensor, a display penal and a display device, aiming to reduce an area of the active pixel sensing circuit structure. A control electrode of a second transistor in the active pixel sensing circuit structure is located in a first metal layer. A first voltage signal line, a second voltage signal line, and an output signal line are located in a second metal layer that is located on a side of the first metal layer facing away from the substrate. A first electrode of a photodiode is connected to the control electrode of the second transistor through a first connection line. The first connection line is located in a third metal layer that is located on a side of the second metal layer facing away from the substrate.

18 Claims, 9 Drawing Sheets

ACTIVE PIXEL SENSING CIRCUIT STRUCTURE AND ACTIVE PIXEL SENSOR, DISPLAY PANEL AND DISPLAY DEVICE

CROSS-REFERENCE TO RELATED APPLICATIONS

The present disclosure claims priority to Chinese Patent Application No. 201910815777.6, filed on Aug. 30, 2019, the content of which is incorporated herein by reference in its entirety.

TECHNICAL FIELD

The present disclosure relates to the technical field of image sensing technologies, and in particular, to an active pixel sensing circuit structure, an active pixel sensor, a display panel, and a display device.

BACKGROUND

In recent years, with continuous developments of display technologies, display devices using fingerprint identification that achieve user privacy protection are increasingly developed. When a user operates a display device with a fingerprint identification function, the user only needs to touch a display screen with a finger to achieve authority verification, which is a simple operation.

For a display device applying an optical fingerprint identification technology, the steps include using an image sensor in a fingerprint sensor to receive reflected light of a fingerprint and then using a difference of reflected light between positions of valleys and ridges of the fingerprint to achieve fingerprint identification. At present, image sensors mainly include a passive pixel sensor (PPS) and an active pixel sensor (APS), and the APS has been widely used in manufacturing large-size and high-resolution fingerprint sensors, because its sensitivity is independent of an area of a photodiode and it is more applicable in long-distance transmission.

At present, how to reduce an area of the APS while improving the resolution of fingerprint sensor has become a research focus.

SUMMARY

In view of this, the present disclosure provides an active pixel sensing circuit structure, an active pixel sensor, a display panel, and a device.

In an aspect, an embodiment of the present disclosure provides an active pixel sensing circuit structure, including: a first transistor including a control electrode, a first electrode and a second electrode; a second transistor including a control electrode, a first electrode and a second electrode; a third transistor including a control electrode, a first electrode and a second electrode; a reset control signal line, a read control signal line, a first voltage signal line, a second voltage signal line, an output signal line; and a photodiode including a first electrode. The first transistor, the second transistor, the third transistor, the reset control signal line, the read control signal line, the first voltage signal line, the second voltage signal line, and the output signal line are located on a same side of a substrate; and the photodiode is located on a side of the second transistor facing away from the substrate. The reset control signal line is electrically connected to the control electrode of the first transistor, the read control signal line is electrically connected to the control electrode of the third transistor, the first voltage signal line is electrically connected to the first electrode of the first transistor, the second voltage signal line is electrically connected to the first electrode of the second transistor, the output signal line is electrically connected to the second electrode of the third transistor, the second electrode of the second transistor is electrically connected to the first electrode of the third transistor; the second electrode of the first transistor, the control electrode of the second transistor, and the first electrode of the photodiode are electrically connected; and the first electrode of the photodiode is electrically connected to the control electrode of the second transistor through a first connection line. The control electrode of the second transistor is located in a first metal layer; the first voltage signal line, the second voltage signal line, and the output signal line are located in a second metal layer; the first connection line is located in a third metal layer; and the first electrode of the photodiode is located in a fourth metal layer. The second metal layer is located on a side of the first metal layer facing away from the substrate, the third metal layer is located on a side of the second metal layer facing away from the substrate, and the fourth metal layer is located on a side of the third metal layer facing away from the first metal layer.

In another aspect, an embodiment of the present disclosure provides an active pixel sensor, including a plurality of active pixel sensing circuit structures arranged in an array. Each of the plurality of active pixel sensing circuit structures is an active pixel sensing circuit structure, including: a first transistor including a control electrode, a first electrode and a second electrode; a second transistor including a control electrode, a first electrode and a second electrode; a third transistor including a control electrode, a first electrode and a second electrode; a reset control signal line, a read control signal line, a first voltage signal line, a second voltage signal line, an output signal line; and a photodiode including a first electrode. The first transistor, the second transistor, the third transistor, the reset control signal line, the read control signal line, the first voltage signal line, the second voltage signal line, and the output signal line are located on a same side of a substrate; and the photodiode is located on a side of the second transistor facing away from the substrate. The reset control signal line is electrically connected to the control electrode of the first transistor, the read control signal line is electrically connected to the control electrode of the third transistor, the first voltage signal line is electrically connected to the first electrode of the first transistor, the second voltage signal line is electrically connected to the first electrode of the second transistor, the output signal line is electrically connected to the second electrode of the third transistor, the second electrode of the second transistor is electrically connected to the first electrode of the third transistor; the second electrode of the first transistor, the control electrode of the second transistor, and the first electrode of the photodiode are electrically connected; and the first electrode of the photodiode is electrically connected to the control electrode of the second transistor through a first connection line. The control electrode of the second transistor is located in a first metal layer; the first voltage signal line, the second voltage signal line, and the output signal line are located in a second metal layer; the first connection line is located in a third metal layer; and the first electrode of the photodiode is located in a fourth metal layer. The second metal layer is located on a side of the first metal layer facing away from the substrate, the third metal layer is located on a side of the second metal layer facing away from the substrate, and the fourth metal layer is located on a side of the third metal layer facing away from the first metal layer. The reset control signal line and the read control signal line extend in a first direction and are arranged in a second direction; the first voltage signal line, the second voltage signal line, and the output signal line extend in the second direction and are arranged in the first direction; wherein the first direction intersects the second direction. In the second direction, the reset control signal line of an $i^{th}$ active pixel sensing circuit structure of the plurality of active pixel sensing circuit structures is reused as the read control signal line of a $(i+1)^{th}$ active pixel sensing circuit structure of the plurality of active pixel sensing circuit structures, where i is an integer larger than or equal to 1.

In still another aspect, an embodiment of the present disclosure provides a display panel, including an active pixel sensor. The active pixel sensor includes a plurality of active pixel sensing circuit structures arranged in an array. Each of the plurality of active pixel sensing circuit structures is an active pixel sensing circuit structure, including: a first transistor including a control electrode, a first electrode and a second electrode; a second transistor including a control electrode, a first electrode and a second electrode; a third transistor including a control electrode, a first electrode and a second electrode; a reset control signal line, a read control signal line, a first voltage signal line, a second voltage signal line, an output signal line; and a photodiode including a first electrode. The first transistor, the second transistor, the third transistor, the reset control signal line, the read control signal line, the first voltage signal line, the second voltage signal line, and the output signal line are located on a same side of a substrate; and the photodiode is located on a side of the second transistor facing away from the substrate. The reset control signal line is electrically connected to the control electrode of the first transistor, the read control signal line is electrically connected to the control electrode of the third transistor, the first voltage signal line is electrically connected to the first electrode of the first transistor, the second voltage signal line is electrically connected to the first electrode of the second transistor, the output signal line is electrically connected to the second electrode of the third transistor, the second electrode of the second transistor is electrically connected to the first electrode of the third transistor; the second electrode of the first transistor, the control electrode of the second transistor, and the first electrode of the photodiode are electrically connected; and the first electrode of the photodiode is electrically connected to the control electrode of the second transistor through a first connection line. The control electrode of the second transistor is located in a first metal layer; the first voltage signal line, the second voltage signal line, and the output signal line are located in a second metal layer; the first connection line is located in a third metal layer; and the first electrode of the photodiode is located in a fourth metal layer. The second metal layer is located on a side of the first metal layer facing away from the substrate, the third metal layer is located on a side of the second metal layer facing away from the substrate, and the fourth metal layer is located on a side of the third metal layer facing away from the first metal layer. The reset control signal line and the read control signal line extend in a first direction and are arranged in a second direction; the first voltage signal line, the second voltage signal line, and the output signal line extend in the second direction and are arranged in the first direction; wherein the first direction intersects the second direction. In the second direction, the reset control signal line of an $i^{th}$ active pixel sensing circuit structure of the plurality of active pixel sensing circuit structures is reused as the read control signal line of a $(i+1)^{th}$ active pixel sensing circuit structure of the plurality of active pixel sensing circuit structures, where i is an integer larger than or equal to 1.

In yet another aspect, an embodiment of the present disclosure provides a display device, including a display panel. The display panel includes an active pixel sensor. The active pixel sensor includes a plurality of active pixel sensing circuit structures arranged in an array. Each of the plurality of active pixel sensing circuit structures is an active pixel sensing circuit structure, including: a first transistor including a control electrode, a first electrode and a second electrode; a second transistor including a control electrode, a first electrode and a second electrode; a third transistor including a control electrode, a first electrode and a second electrode; a reset control signal line, a read control signal line, a first voltage signal line, a second voltage signal line, an output signal line; and a photodiode including a first electrode. The first transistor, the second transistor, the third transistor, the reset control signal line, the read control signal line, the first voltage signal line, the second voltage signal line, and the output signal line are located on a same side of a substrate; and the photodiode is located on a side of the second transistor facing away from the substrate. The reset control signal line is electrically connected to the control electrode of the first transistor, the read control signal line is electrically connected to the control electrode of the third transistor, the first voltage signal line is electrically connected to the first electrode of the first transistor, the second voltage signal line is electrically connected to the first electrode of the second transistor, the output signal line is electrically connected to the second electrode of the third transistor, the second electrode of the second transistor is electrically connected to the first electrode of the third transistor; the second electrode of the first transistor, the control electrode of the second transistor, and the first electrode of the photodiode are electrically connected; and the first electrode of the photodiode is electrically connected to the control electrode of the second transistor through a first connection line. The control electrode of the second transistor is located in a first metal layer; the first voltage signal line, the second voltage signal line, and the output signal line are located in a second metal layer; the first connection line is located in a third metal layer; and the first electrode of the photodiode is located in a fourth metal layer. The second metal layer is located on a side of the first metal layer facing away from the substrate, the third metal layer is located on a side of the second metal layer facing away from the substrate, and the fourth metal layer is located on a side of the third metal layer facing away from the first metal layer. The reset control signal line and the read control signal line extend in a first direction and are arranged in a second direction; the first voltage signal line, the second voltage signal line, and the output signal line extend in the second direction and are arranged in the first direction; wherein the first direction intersects the second direction. In the second direction, the reset control signal line of an $i^{th}$ active pixel sensing circuit structure of the plurality of active pixel sensing circuit structures is reused as the read control signal line of a $(i+1)^{th}$ active pixel sensing circuit structure of the plurality of active pixel sensing circuit structures, where i is an integer larger than or equal to 1.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that, although a transistor may be described using the terms of "first", "second", "third", etc., in the embodiments of the present disclosure, the transistor will not be limited to these terms. These terms are merely used to distinguish transistors from one another. For example, without departing from the scope of the embodiments of the present disclosure, a first transistor may also be referred to as a second transistor, and similarly, a second transistor may also be referred to as a first transistor.

Figure 1:
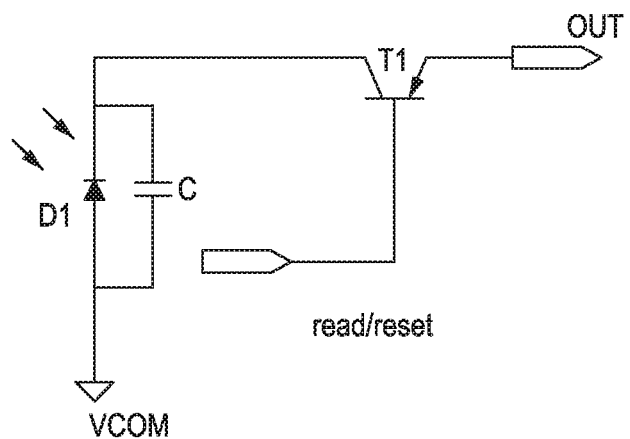
FIG. 1 is a schematic diagram of a passive pixel sensing circuit.
Figure 2:
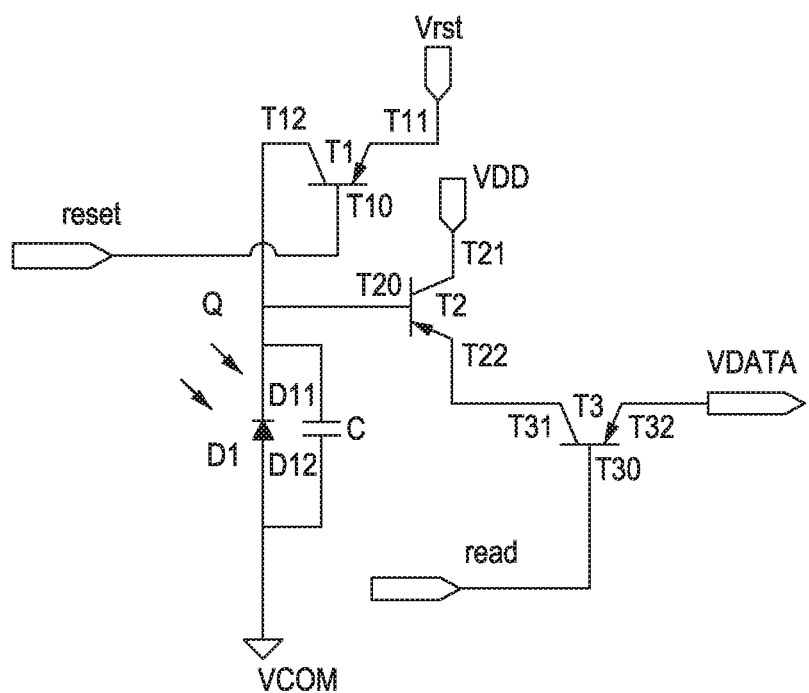
FIG. 2 is a schematic diagram of an active pixel sensing circuit.

The inventors have found that for a PPS circuit structure shown in FIG. 1, since an amount of output charge is proportional to an area of a photodiode D1, the area needs to be set as 50 µm×50 µm or larger so as to achieve a required sensitivity; while for an APS circuit structure shown in FIG. 2, since its sensitivity is independent of the area of the photodiode D1, a resolution can be improved by compressing an area of the APS. However, since the APS includes a plurality of electrical components including a photodiode, a plurality of transistors, and a plurality of signal lines connected to the plurality of transistors, when compressing the area of the APS, a short circuit between different electrical components therein may occur.

Figure 3:
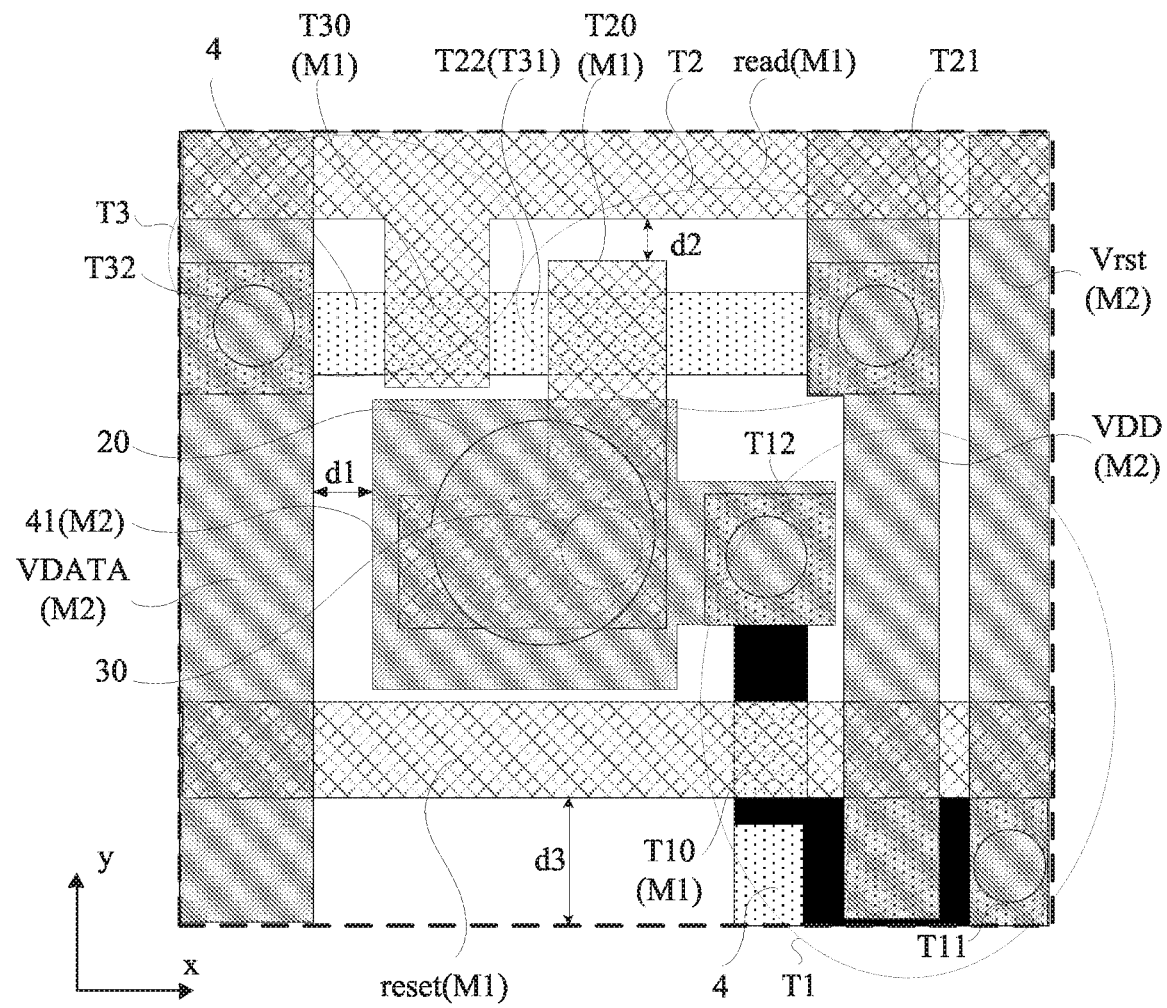
FIG. 3 is a schematic diagram of a layout design of an active pixel sensing circuit according to an embodiment of the present disclosure.
Figure 4:
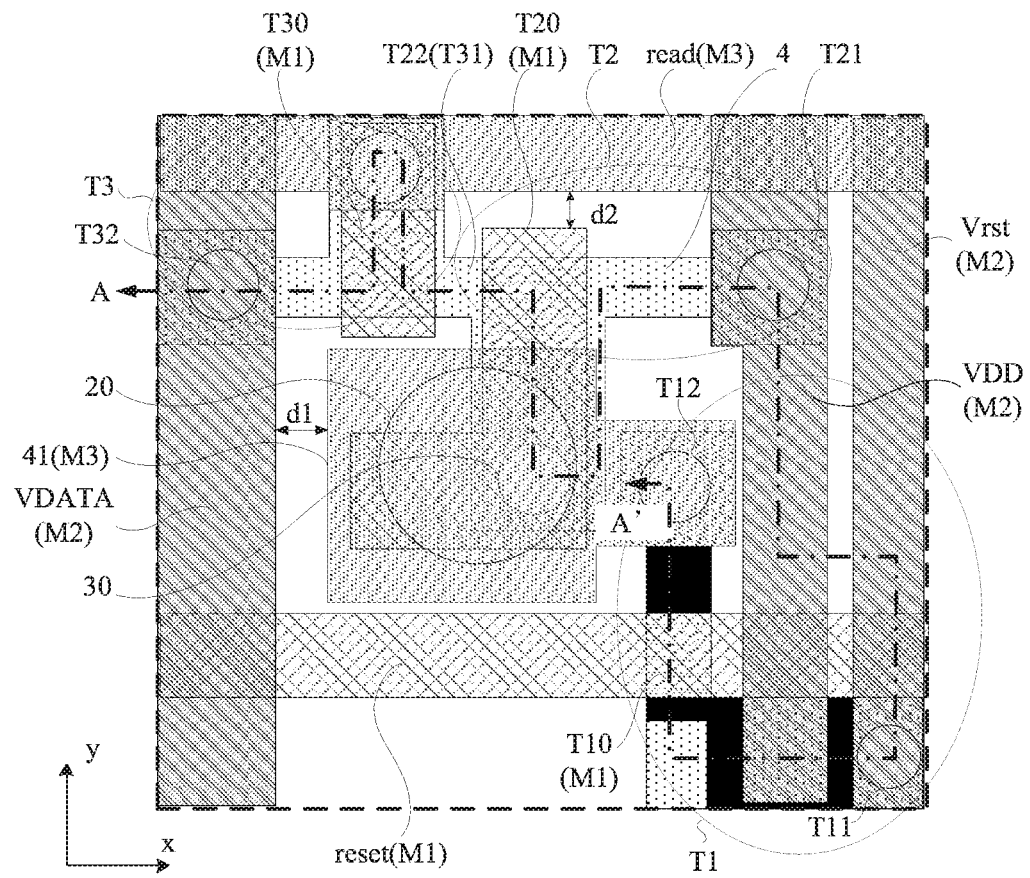
FIG. 4 is a schematic diagram of another layout design of an active pixel sensing circuit according to an embodiment of the present disclosure.
Figure 5:
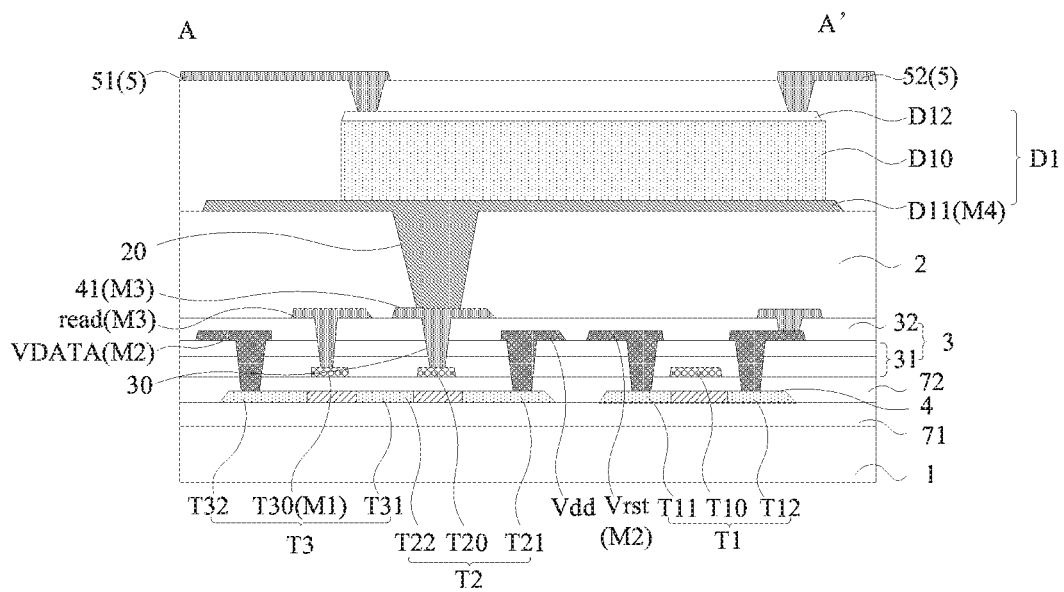
FIG. 5 is a schematic cross-sectional view along line AA' of FIG. 4.

In view of this, an embodiment of the present disclosure provides an active pixel sensing circuit structure. FIG. 3 is a schematic diagram of a layout design of an active pixel sensing circuit according to an embodiment of the present disclosure. FIG. 4 is a schematic diagram of another layout design of an active pixel sensing circuit according to an embodiment of the present disclosure. FIG. 5 is a schematic cross-sectional view along line AA' of FIG. 4. As shown in FIGS. 2-5, the active pixel sensing circuit structure includes a first transistor T1, a second transistor T2, a third transistor T3 and a photodiode D1 (not shown in FIG. 3). The first transistor T1 includes a control electrode electrically connected to a reset control signal line reset, a first electrode T11 electrically connected to a first voltage signal line Vrst, and a second electrode T12 electrically connected to a control electrode T20 of the second transistor T2 and a first electrode D11 (not shown in FIG. 3) of the photodiode D1. The second transistor T2 includes the control electrode T20, a first electrode T21 electrically connected to a second voltage signal line VDD, and a second electrode T22 electrically connected to a first electrode T31 of the third transistor T3. The third transistor T3 includes a control electrode T30 electrically connected to a read control signal line read, the first electrode T31, and a second electrode T32 electrically connected to an output signal line VDATA.

It should be noted that photodiode D1 is not shown in FIG. 3 and FIG. 4 for the sake of simplification. In order to allow an area of the active pixel sensing circuit to be set as small as possible, in an embodiment of the present disclosure, the photodiode D1 at least partially overlaps the area shown in FIGS. 3 and 4. As shown in FIG. 5, the photodiode D1 may cover the first transistor T1, the second transistor T2, and the third transistor T3.

It should be understood that in FIG. 3 and FIG. 4, areas with a same fill pattern signify that respective structures are located in a same film layer.

When designing a structure of the active pixel sensing circuit, in this embodiment, the first transistor T1, the second transistor T2, the third transistor T3, the photodiode D1, the reset control signal line reset, the read control signal line read, the first voltage signal Line Vrst, the second voltage signal line VDD and the output signal line VDATA are arranged at a same side of a substrate 1. The photodiode D1 is located on a side of the second transistor T2 facing away from the substrate 1. The control electrode T10 of the first transistor T1, the control electrode T20 of the second transistor T2, and the control electrode T30 of the third transistor T3 are all located in a first metal layer M1. The first voltage signal line Vrst, the second voltage signal line VDD and the output signal line VDATA are located in a second metal layer M2 that is different from the first metal layer M1. The second metal layer M2 is located on a side of the first metal layer M1 facing away from the substrate 1. The first electrode D11 of the photodiode D1 is electrically connected to the control electrode T20 of the second transistor T2 through a first connection line 41.

As shown in FIG. 3, the reset control signal line reset and the read control signal line read are located in the first metal layer M1, and the first connection line 41 is located in the second metal layer M2. Based on a structure of the active pixel sensing circuit shown in FIG. 3, a minimum pixel size of the active pixel sensing circuit is approximately 35 um×35 um according to a process sequence similar to that of a conventional thin film transistor in a display panel. Therefore, an occupied area of the circuit structure is reduced by 30% compared to the PPS in the related art. The structure of the active pixel sensing circuit in this scheme can achieve a relatively high sensor resolution by reasonable arrangement.

Further, a structure as shown in FIG. 4 and FIG. 5 has been proposed in some embodiments. In this configuration, the first connection line 41 is located in a third metal layer M3, and the first electrode D11 of the photodiode D1 is located in a fourth metal layer M4. Here, the third metal layer M3 is located on a side of the second metal layer M2 facing away from the substrate 1, and the fourth metal layer M4 is located on a side of the third metal layer M3 facing away from the first metal layer M1.

With the active pixel sensing circuit structure provided by this embodiment of the present disclosure, the output signal line VDATA electrically connected to the second electrode T32 of the third transistor T3 is located in the second metal layer M2, and the first connection line 41 connecting the first electrode D11 of the photodiode D1 with the control electrode T20 of the second transistor T2 is located in the third metal layer M3. That is, the output signal line VDATA and the first connection line 41 are located in different film layers. Thus, when a distance d1 between the output signal line VDATA and the first connection line 41 is decreased, a short circuit between the two will not occur and thus the active pixel sensing circuit can operate normally. Therefore, with the active pixel sensing circuit structure provided by this embodiment of the present disclosure, the distance d1 between the output signal line VDATA and the first connection line 41 can be greatly decreased while achieving normal operation of the active pixel sensing circuit. In this way, the area of the active pixel sensing circuit structure is decreased, thereby increasing the resolution of the active pixel sensor formed by the active pixel sensing circuit structure.

In an example, as shown in FIG. 5, the photodiode D1 described above further includes an active layer D10 and a second electrode D12 that are stacked on a side of the first electrode D11 of the photodiode D1 facing away from the substrate 1, and the active layer D10 is located between the first electrode D11 and the second electrode D12 of the photodiode D1. The second electrode D12 of the photodiode D1 receives a third voltage signal through a third voltage signal line Vcom. For example, the second electrode D12 of photodiode D1 may be made of a transparent metal oxide such as indium tin oxide, indium zinc oxide or the like.

As shown in FIG. 5, the active pixel sensing circuit structure further includes an electrode connection layer 5 connecting the second electrode D12 of the photodiode D1 with the third voltage signal line Vcom (not shown in FIG. 5). The electrode connection layer 5 is located on a side of the second electrode D12 facing away from the substrate 1.

In order to achieve good conductivity of the electrode connection layer 5, the electrode connection layer 5 is usually made of a metal material. Since the metal material is generally not transparent, in this embodiment of the present disclosure as shown in FIG. 5, the electrode connection layer 5 is implemented as a first electrode connection layer 51 and a second electrode connection layer 52 respectively connected to two ends of the second electrode D12 of the photodiode D1. In this way, on the basis of increasing an electrical connection passage between the electrode connection layer 5 and the second electrode D12 of the photodiode D1, most area of the active layer D10 can be exposed, thereby avoiding an influence on generation of photon-generated carriers of the active layer D10 under illumination. Therefore, the photodiode D1 can operate normally.

In an embodiment, the photodiode D1 may be a PIN type of photodiode, in which an intrinsic semiconductor I layer is sandwiched between a P-type semiconductor and an N-type semiconductor.

Figure 6:
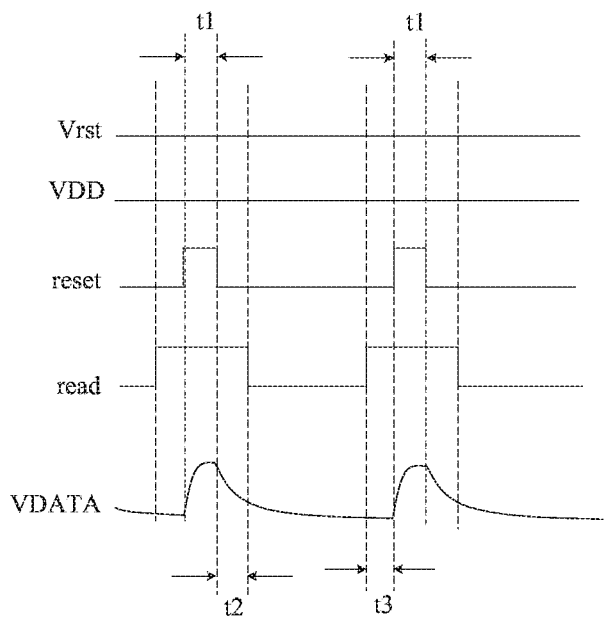
FIG. 6 is an operation sequence diagram corresponding to FIG. 2.

FIG. 6 is an operation sequence diagram corresponding to FIG. 2. As shown in FIG. 6, an operation process of the active pixel sensing circuit includes a reset period t1 and an exposure period. The exposure period includes a first read period t2 and a second read period t3.

In the reset period t1, a high level provided by the reset control signal line reset controls the first transistor T1 to be turned on, and a voltage on the first voltage signal line Vrst is transmitted to a Q node through the first transistor T1 so as to reset a potential of the Q node. At this time, the potential of the Q node is higher than the third voltage signal provided by the third voltage signal line Vcom. If the photodiode D1 is not under illumination, the photodiode D1 is in a reverse bias and off state.

In the first read period t2, a low level provided by the reset control signal line reset controls the first transistor T1 to be turned off, and a high level provided by the read control signal line read controls the third transistor T3 to be turned on. Under illumination, the photodiode D1 generates a leakage current flowing from the Q node to the third voltage signal line Vcom, causing the potential of the Q node to decrease. The second transistor T2 generates a leakage current under control of the Q node and transmits it to the output signal line VDATA through the third transistor T3, and the output signal line VDATA outputs a voltage value V1.

With the increase of exposure time, the potential of the Q node keeps decreasing.

In the second read period t3, a low level provided by the reset control signal line reset controls the first transistor T1 to be turned off, and a high level provided by the read control signal line read controls the third transistor T3 to be turned on. The second transistor T2 generates a leakage current under control of the Q node and transmits it to the output signal line VDATA through the third transistor T3, and the output signal line VDATA outputs a voltage value V2.

During fingerprint detection, intensities of light reflected to the photodiode D1 for different fingerprint areas are different. The light intensity determines a size of a leakage current of the photodiode D1, the size of the current leakage of the photodiode D1 determines a potential of the Q node, and the potential of the Q node determines an output voltage value of the output signal line VDATA. Thus, values of V1-V2 described above can indicate intensity of light received by the photodiode D1. That is, fingerprint identification can be achieved by detecting corresponding values of V1-V2 obtained at different positions in the fingerprint identification area.

It should be understood that the above description is merely an example in which the first transistor T1, the second transistor T2, and the third transistor T3 are NMOS transistors. In other embodiments, the first transistor T1, the second transistor T2, and the third transistor T3 may also be PMOS transistors, and the embodiments of the present disclosure will not be limited thereto. When the transistors are PMOS transistors, the reset control signal line "reset" and the read control signal line read "transmit" low level signals to turn on the first transistor T1 and the third transistor T3 at corresponding times.

In an example, as shown in FIG. 5, a planarization layer 2 is arranged between the third metal layer M3 and the fourth metal layer M4, and the planarization layer 2 includes a first through hole 20 penetrating the planarization layer 2. An interlayer insulation layer 3 is arranged between the third metal layer M3 and the first metal layer M1, and the interlayer insulation layer 3 includes a second through hole 30 penetrating the interlayer insulation layer 3. The first electrode D11 of the photodiode D1 is electrically connected to the first connection line 41 through the first through hole 20. The first connection line 41 is electrically connected to the control electrode T20 of the second transistor T2 through the second through hole 30. In such a configuration provided by this embodiment of the present disclosure, on the basis of reducing the area of the active pixel sensing circuit structure, the first electrode D11 of the photodiode D1 and the control electrode T20 of the second transistor T2 that are located in different film layers can be connected by the first through hole 20 and the second through hole 30, thereby allowing the active pixel sensing circuit to operate normally. Moreover, in this embodiment of the present disclosure, by providing the planarization layer 2 between the third metal layer M3 and the fourth metal layer M4, flatness of the first electrode D11 of the photodiode D1 can be achieved, and thus leakage of the first electrode D11 of the photodiode D1 due to uneven surface then can be avoided.

In an example, the above-described planarization layer 2 is an organic layer, and the interlayer insulation layer 3 is an inorganic layer. Compared with an inorganic material, an organic material can make the planarization layer more flat because of its better film-forming properties. For example, the planarization layer 2 may be formed using an organic layer such as a benzocyclobutene (BCB) film, a polyimide film or a polyacrylic film.

In an example, an area of an orthographic projection of the above-described first through hole 20 onto a plane of the substrate 1 is larger than an area of an orthographic projection of the second through hole 30 onto the plane of the substrate 1. The larger area of the first through hole 20 causes a thicker connection line between the first electrode D11 of the photodiode D1 and the first connection line 41, thereby reducing a resistance of the connection line between the first electrode line 11 of the photodiode D1 and the first connection line 41, which is advantageous for alleviating attenuation of a signal between the first electrode line 11 of the photodiode D1 and the first connection line 41. Moreover, when the area of the first through hole 20 is increased, correspondingly, an area of the first connection line 41 located on a side of the first through hole 20 close to the substrate 1 will also be increased. If the output signal line VDATA and the first connection line 41 are arranged in a same layer, when the area of the first connection line 41 is increased, a short circuit between the output signal line VDATA and the first connection line 41 may occur. However, in this embodiment of the present disclosure, by arranging the output signal line VDATA and the first connection line 41 in different film layers, a short circuit between the first connection line 41 and the output signal line VDATA will not happen on the basis of alleviating the attenuation of the signal between the first electrode line 11 of the photodiode D1 and the first connection line 41. Therefore, the active pixel sensing circuit can operate reliably.

In an example, as shown in FIG. 4 and FIG. 5, the orthographic projection of the first through hole 20 onto the plane of the substrate 1 at least partially overlaps the orthographic projection of the second through hole 30 onto the plane of the substrate 1. Compared with a case in which the orthographic projection of the first through hole 20 onto the plane of the substrate 1 is separated from the orthographic projection of the second through hole 30 onto the plane of the substrate 1, the configuration in this embodiment of the present disclosure can reduce a sum of the areas of the orthographic projections of the first through hole 20 and the second through hole 30 onto the plane of the substrate 1. That is, an arrangement of the first through hole 20 and the second through hole 30 can be more compact, thereby facilitating further reducing the area of the active pixel sensing circuit structure.

In an example, as shown in FIG. 3 and FIG. 4, the reset control signal line "reset" and the read control signal line "read" extend in a first direction x and are arranged in a second direction y. The first voltage signal line Vrst, the second voltage signal line VDD and the output signal line VDATA extend in the second direction y and are arranged in the first direction x. The first direction x intersects the second direction y. In the first direction x, the first transistor T1, the second transistor T2, and the third transistor T3 are located between the first voltage signal line Vrst and the output signal line VDATA. In the second direction y, the first transistor T1, the second transistor T2, and the third transistor T3 are located between the reset control signal line reset and the read control signal line read. The second transistor T2 and the third transistor T3 are arranged in the first direction x.

Such a configuration provided by this embodiment of the present disclosure can make an arrangement of the active pixel sensing circuit structure more regular and compact, thereby facilitating further reduction of the area of the active pixel sensing circuit structure. As shown in FIG. 4, the reset control signal line "reset" and the read control signal line "read" are respectively insulated from and intersect the first voltage signal line Vrst, the second voltage signal line VDD, and the output signal line VDATA. The first transistor T1, the second transistor T2, and the third transistor T3 are arranged in a rectangular-like shape as shown in FIG. 4, formed by arranging a plurality of signal lines described above. In this case, an area of a rectangle as shown by a dashed box in FIG. 4 can be regarded as an area of a single active pixel sensing circuit structure.

In an example, as shown in FIG. 4, the first transistor T1 and the second transistor T2 are arranged in the second direction y. That is, the first transistor T1, the second transistor T2, and the third transistor T3 are arranged in a triangle, thereby preventing an active pixel sensing circuit including the three transistors from being formed into a pattern that is extremely narrow in a single direction.

In an example, when forming the above-described three transistors, the active layer 4 of each transistor may be arranged in various manners. For example, as shown in FIG. 3 and FIG. 4, the active layer 4 of the second transistor T2 and the active layer 4 of the third transistor T3 extend in the first direction x, and a portion of the active layer 4 of the first transistor T1 extends in the first direction x.

Figure 7:
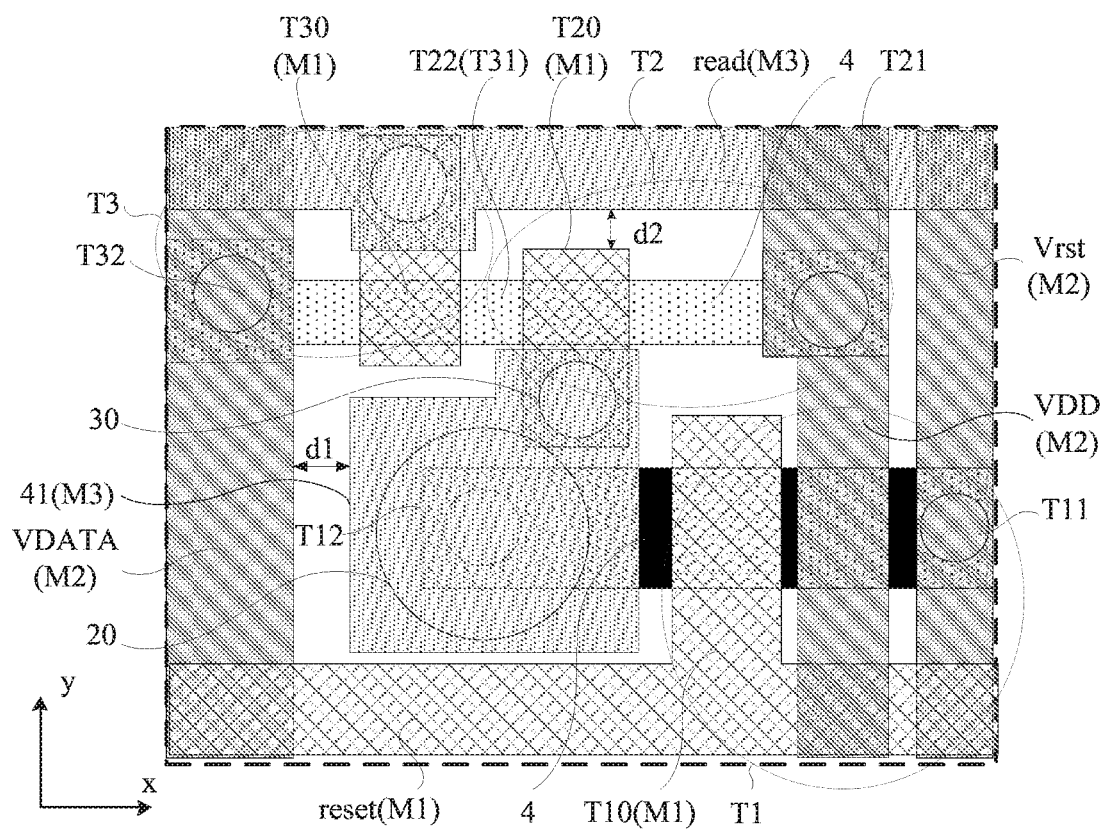
FIG. 7 is a schematic diagram of still another layout design of an active pixel sensing circuit according to an embodiment of the present disclosure.

FIG. 7 is a schematic diagram of still another layout design of an active pixel sensing circuit according to an embodiment of the present disclosure. Alternatively, as shown in FIG. 7, the extending direction of the active layer 4 of the first transistor T1 may also be adjusted in such a manner that the active layer 4 of the first transistor T1 also extends in the first direction x, thereby reducing a size of the active pixel sensing circuit structure in the second direction y.

In an example, as shown in FIG. 4, FIG. 5 and FIG. 7, the reset control signal line reset and the control electrode T10 of the first transistor T1 are arranged in a same layer, and the read control signal line read and the first connection line 41 are arranged in a same layer. That is, the reset control signal line reset is arranged in the first metal layer M1, and the read control signal line read is arranged in the third metal layer M3. In this embodiment of the present disclosure, the read control signal line read is arranged in the third metal layer M3. In this way, on the one hand, since the control electrode T20 of the second transistor T2 is arranged in the first metal layer M1, a distance d2 between the control electrode T20 of the second transistor T2 and the read control signal line "read" can also be compressed and a short circuit between the two will not occur, which is advantageous for further reducing the area of the active pixel sensing circuit structure.

On the other hand, when the active pixel sensor is formed by the arrangement of the active pixel sensing circuit structure shown in FIG. 4, FIG. 5 and FIG. 7, the reset control signal line "reset" and the read control signal line "read" of active pixel sensing circuits in two adjacent rows are adjacently arranged. In this embodiment of the present disclosure, the read control signal line read is arranged in the third metal layer M3 that is different from the first metal layer M1 (the layer where the reset control signal line reset is located). Compared with a case as shown in FIG. 3, in this embodiment, a distance d3 between active pixel sensing circuits in two adjacent two rows can be compressed, and a short circuit between the read control signal line read and the reset control signal line reset of active pixel sensing circuits in two adjacent rows will not occur. In this way, a larger number of active pixel sensing circuits can be arranged in a certain area, which is advantageous for further improving the resolution of the active pixel sensor.

In addition, in this embodiment of the present disclosure, by arranging the read control signal line "read" and the first connection line 41 in a same layer, it avoids a new film layer for arranging the read control signal line "read," thereby avoiding an excessive thickness of the active pixel sensing circuit structure while reducing the area of the active pixel sensing circuit structure.

Figure 8:
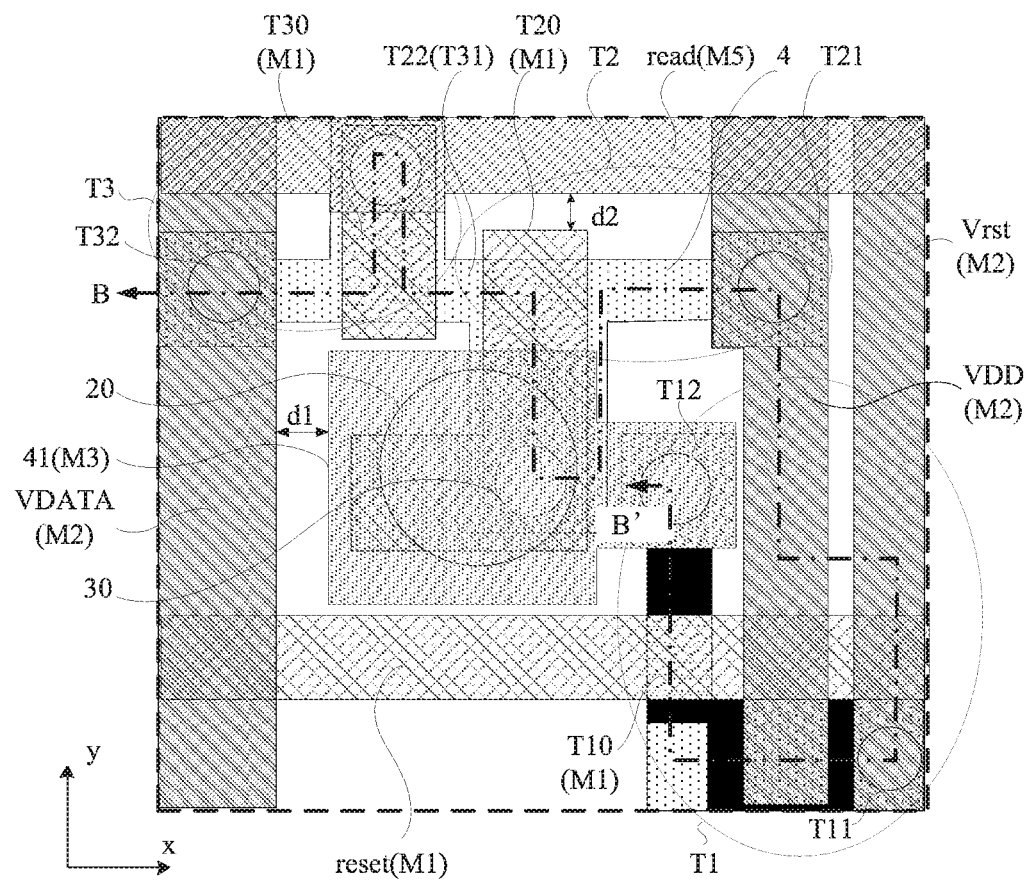
FIG. 8 is a schematic diagram of yet another layout design of an active pixel sensing circuit according to an embodiment of the present disclosure.
Figure 9:
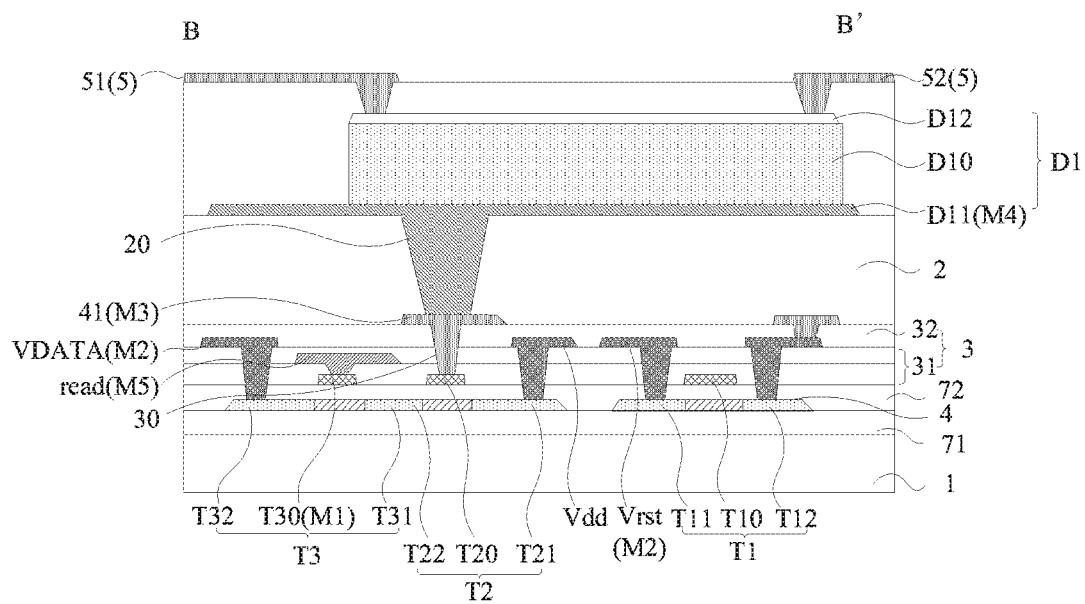
FIG. 9 is a schematic cross-sectional view along line BB' of FIG. 8.

Alternatively, in an embodiment of the present disclosure, the read control signal line "read" may also be arranged in another film layer. FIG. 8 is a schematic diagram of yet another layout design of an active pixel sensing circuit according to an embodiment of the present disclosure. FIG. 9 is a schematic cross-sectional view along line BB' of FIG. 8. As shown in FIG. 8 and FIG. 9, in an embodiment of the present disclosure, a fifth metal layer M5 may be arranged between the first metal layer M1 and the third metal layer M3, and the read control signal line "read" is arranged in the fifth metal layer M5, and the reset control signal line "reset" is still arranged in the first metal layer M1. In this case, the distance d2 between the control electrode T20 of the second transistor T2 and the read control signal line "read" can still be compressed, and the distance between the read control signal line "read" and the reset control signal line "reset" of active pixel sensing circuits in two adjacent rows can still be compressed while achieving normal operation of the active pixel sensing circuit.

Figure 10:
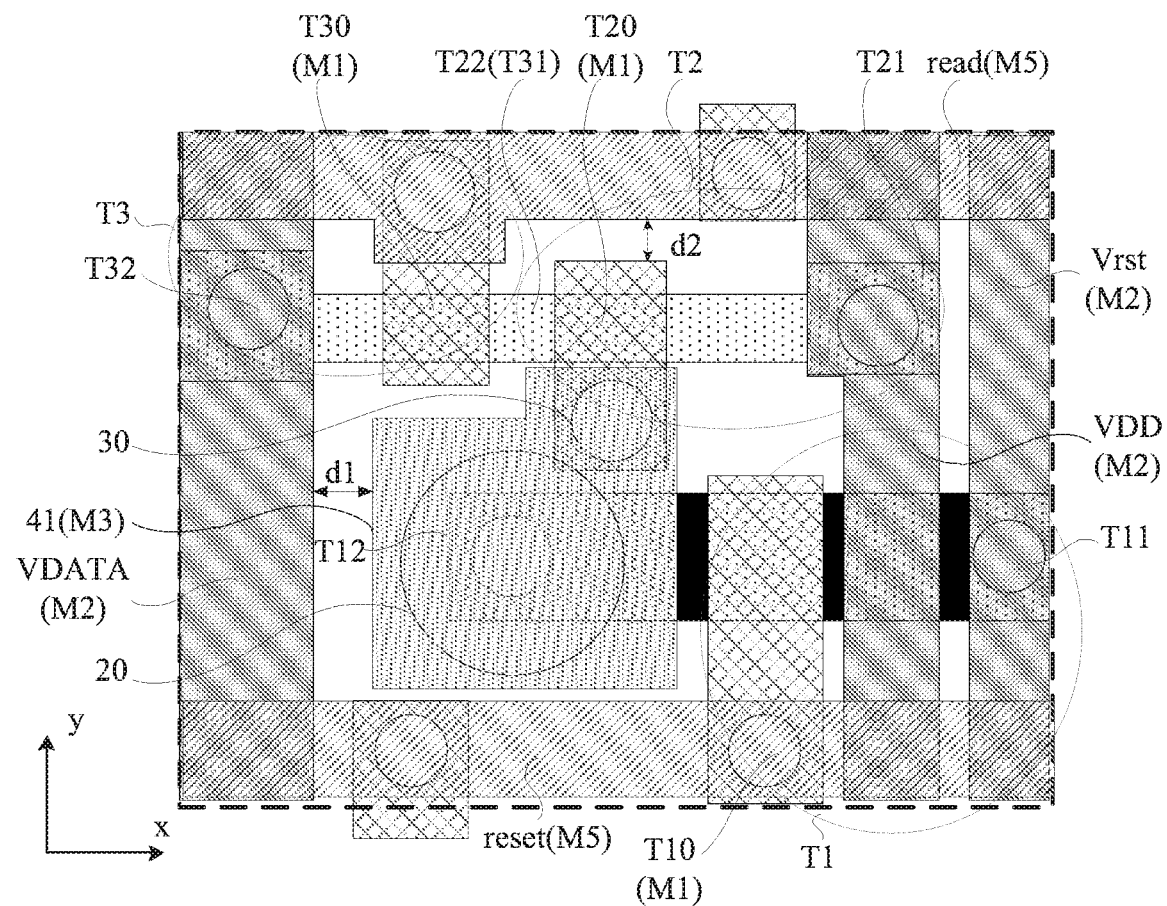
FIG. 10 is a schematic diagram of yet another layout design of an active pixel sensing circuit according to an embodiment of the present disclosure.

FIG. 10 is a schematic diagram of yet another layout design of an active pixel sensing circuit according to an embodiment of the present disclosure. Alternatively, as shown in FIG. 10, in an embodiment of the present disclosure, both the reset control signal line and the read control signal line "read" may be arranged in the fifth metal layer M5. In this case, the distance d2 between the control electrode T20 of the second transistor T2 and the read control signal line "read" can still be compressed, and a short circuit between the two will not occur.

When the reset control signal line "reset" and the read control signal line "read" are arranged in the same layer, and a plurality of active pixel sensing circuits is arranged in an array arranged along the first direction x and the second direction y to form the active pixel sensor, along the second direction y, in an embodiment of the present disclosure, the reset control signal line "reset" of an $i^{th}$ active pixel sensing circuit may be reused as the read control signal line "read" of a $(i+1)^{th}$ active pixel sensing circuit, thereby further reducing the area of the active pixel sensing circuit while increasing the resolution of the active pixel sensor. Here, i is an integer larger than or equal to 1. In the layout design shown in FIG. 3, the area of the active pixel sensing circuit structure is approximately 35 μm×35 μm, which can be reduced to approximately 25 μm×25 μm by the scheme provided by this embodiment of the present disclosure, that is, the area is reduced by approximately 49%.

In an embodiment of the present disclosure, a second connection line may be arranged in the third metal layer M3. One end of the second connection line is electrically connected to a positive power supply voltage signal input terminal that provides a positive power supply voltage signal to the active pixel sensing circuit, and the other end of the second connection line is electrically connected to the first voltage signal line Vrst and/or the second voltage signal line VDD, so as to introduce a constant potential signal on the first voltage signal line Vrst and/or the second voltage signal line VDD through the second connection line located in the third metal layer M3, thereby alleviating the attenuation of the positive power supply voltage signal from the positive power supply voltage signal input terminal to the first voltage signal line Vrst and/or the second voltage signal line VDD.

Figure 11:
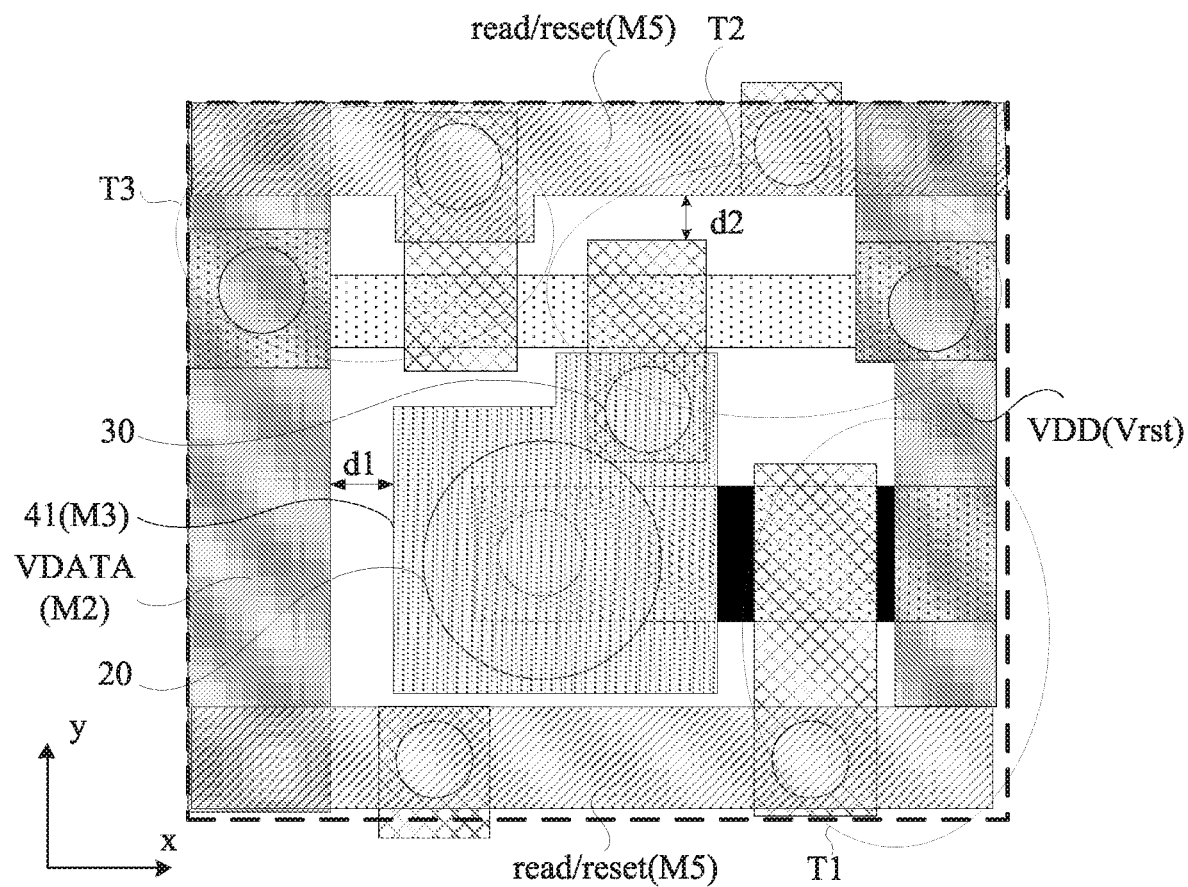
FIG. 11 is a schematic diagram of yet another layout design of an active pixel sensing circuit according to an embodiment of the present disclosure.

FIG. 11 is a schematic diagram of yet another layout design of an active pixel sensing circuit according to an embodiment of the present disclosure. In an embodiment, as shown in FIG. 11, the first voltage signal line Vrst may also be reused as the second voltage signal line VDD. That is, the first electrode T11 of the first transistor T1 and the first electrode T21 of the second transistor T2 receive a same signal. In this case, only one signal line is provided, and one end of this signal line is connected to both the first electrode T11 of the first transistor T1 and the first electrode T21 of the second transistor T2. The other end of this signal line is connected to a same signal terminal of a driving chip. In this way, the number of lines in the active pixel sensing circuit structure can be decreased, thereby further reducing the area thereof.

In an example, when forming the active pixel sensing circuit structure, for formation of the first transistor, the second transistor, and the third transistor, reference can be made to FIG. 5 and FIG. 9, and following steps are performed.

First, a buffer layer 71 is formed on a side of the substrate 1. In an example, the substrate 1 may be made of glass, plastic, or quartz. The buffer layer 71 may be one or more of a silicon dioxide ($SiO_2$) film, a silicon nitride ($SiN_x$) film, and a silicon oxynitride ($SiO_xN_y$) film.

Then, an active layer 4 is formed on a side of the buffer layer 71 facing away from the substrate 1. The active layer 4 may be an amorphous silicon (a-Si) film or a polysilicon (Poly-Si) film. Alternatively, the active layer 4 may be formed by a polysilicon film having a high carrier mobility.

Then, a gate insulation layer 72 is formed on a side of the active layer 4 facing away from the substrate 1. The gate insulation layer 72 may be one or more of a silicon oxide ($SiO_2$) film, a silicon nitride ($SiN_x$) film, and a silicon oxynitride ($SiO_xN_y$) film.

Then, a patterned first metal layer M1 is formed on a side of the gate insulation layer 72 facing away from the substrate 1, so as to form control electrodes of the first transistor T1, the second transistor T2 and the third transistor T3, and the control electrodes at least partially overlap the active layer 4 described above.

Then, the control electrodes described above are used as a mask to dope in the active layer 4 to form a source region and a drain region, and the source region and the drain region are formed in an area that does not overlap the control electrode. A channel region is defined between the source region and drain region (in a cross-sectional view shown in FIG. 5 and FIG. 9, the channel region is distinguished from the source region and drain region by a different fill pattern; and for the sake of simplicity of the figures, in FIG. 3, FIG. 4, FIG. 7, FIG. 8, FIG. 10 and FIG. 11, the channel region is not distinguished from the source region and drain region). In an example, the first electrode and the second electrode of each transistor described above may be respectively a source electrode and a drain electrode. It should be noted that in this embodiment of the present disclosure, the source electrode and the drain electrode of the transistor are doped active layers, and the channel region corresponds to a portion in the active layer that overlaps the control electrode of the transistor. A voltage signal applied on the control electrode can control turn-on or turn-off of the channel region of the active layer, so as to achieve functions of the transistor.

Then, an insulation layer 31 is formed on a side of the first metal layer M1 facing away from the substrate 1, and a through hole is formed in an insulation layer 6 and the gate insulation layer 72 to expose the active layer 4.

Then, a patterned second metal layer M2 is formed on a side of the insulation layer 31 facing away from the substrate 1. So far, the first electrodes, the second electrodes, and the control electrodes of the first transistor T1, the second transistor T2, and the third transistor T3 are formed.

Then, a passivation layer 32 is formed on a side of the second metal layer M2 facing away from the substrate 1. The passivation layer 32 may be one or more of a silicon oxide ($SiO_2$) film, a silicon nitride ($SiN_x$) film, or a silicon oxynitride ($SiO_xN_y$) film. The passivation layer 32 is formed to effectively block gas and moisture, so as to protect each transistor under the passivation layer 32. The passivation layer 32 and the insulation layer 31 together constitute the above-described interlayer insulation layer 3.

Then, a second through hole 30 penetrating the interlayer insulation layer 3 constituted by the passivation layer 32 and the insulation layer 31 is formed to expose the control electrode T20 of the second transistor T2. A through hole is formed in the passivation layer 32 to expose the second electrode T12 of the first transistor T1.

Then, a patterned third metal layer M3 is formed on a side of the passivation layer 32 facing away from the substrate 1, and the patterned third metal layer M3 serves as the first connection line 41.

Then, a planarization layer 3 is formed on a side of the third metal layer M3 facing away from the substrate, and a first through hole 20 penetrating the planarization layer 3 and exposing the first connection line 41 is formed in the planarization layer 3.

Then, a photodiode D1 is formed on a side of the planarization layer 3 facing away from the substrate 1.

Figure 12:
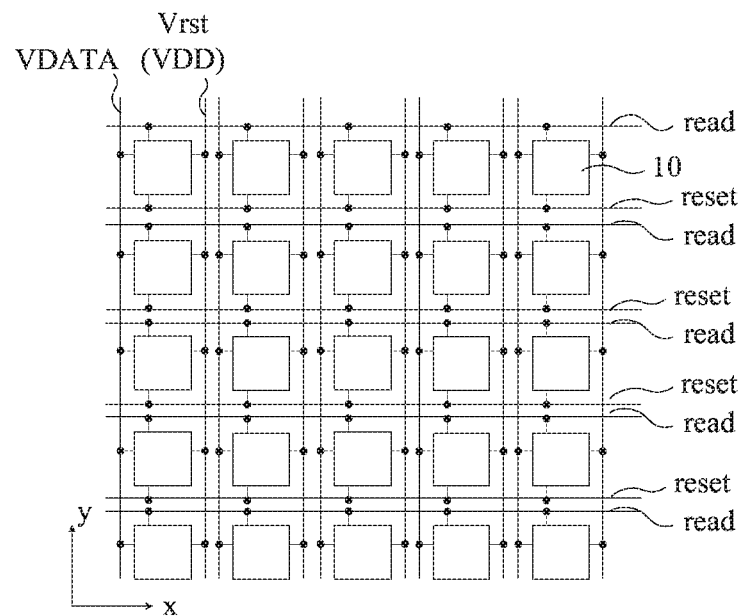
FIG. 12 is a schematic diagram of an active pixel sensor according to an embodiment of the present disclosure.

An embodiment of the present disclosure further provides an active pixel sensor 100. FIG. 12 is a schematic diagram of an active pixel sensor according to an embodiment of the present disclosure. As shown in FIG. 12, the active pixel sensor includes a plurality of active pixel sensing circuit structures 10 arranged in an array.

Figure 13:
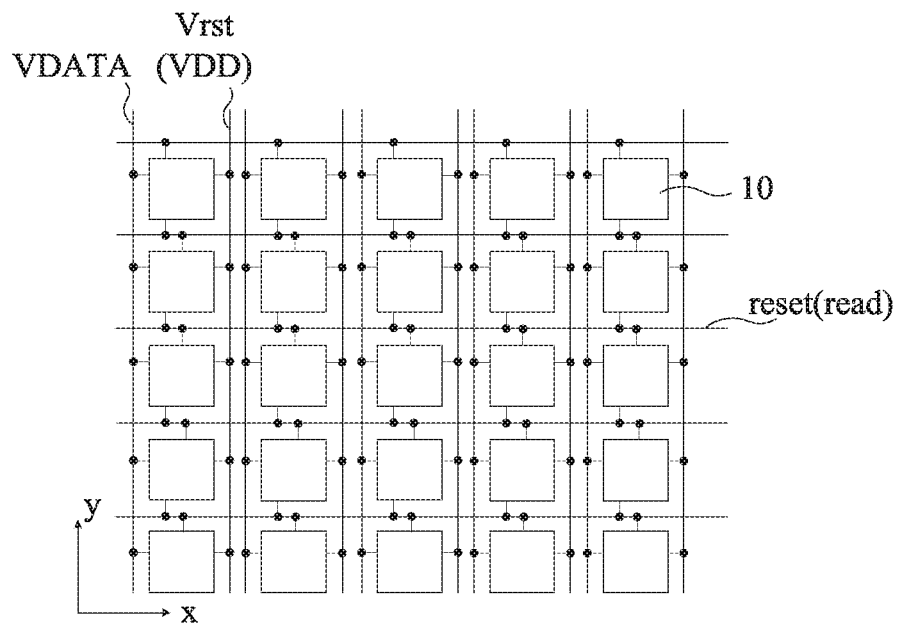
FIG. 13 is a schematic diagram of another active pixel sensor according to an embodiment of the present disclosure.

FIG. 13 is a schematic diagram of another active pixel sensor according to an embodiment of the present disclosure. In an example, as shown in FIG. 13, in the second direction y, the reset control signal line reset of an $i^{th}$ active pixel sensing circuit is reused as the read control signal line read of a $(i+1)^{th}$ active pixel sensing circuit, where i is an integer larger than or equal to 1, thereby further reducing the number of lines in the active pixel sensor and improving the resolution of the active pixel sensor.

In an example, as shown in FIG. 12 and FIG. 13, multiple active pixel sensing circuits located in a same row are electrically connected to a same reset control signal line "reset" and a same read control signal line "read"; and multiple active pixel sensing circuits located in a same column are electrically connected to a same first voltage signal line Vrst, a same second voltage signal line VDD, and a same output signal line VDATA, thereby further increasing the number of lines in the active pixel sensor and improving the resolution of the active pixel sensor.

During an operation of the active pixel sensor, multiple reset control signal lines "reset" and read control signal lines "read" sequentially transmit an turn-on signal. When each reset control signal line "reset" and each read control signal line "read" transmit a turn-on signal, the active pixel sensing circuits connected to the reset control signal line "reset" and the read control signal line "read" respectively receive signals provided by the first voltage signal line Vrst and the second voltage signal line VDD, and output signals through respective output signal lines VDATA.

Figure 14:
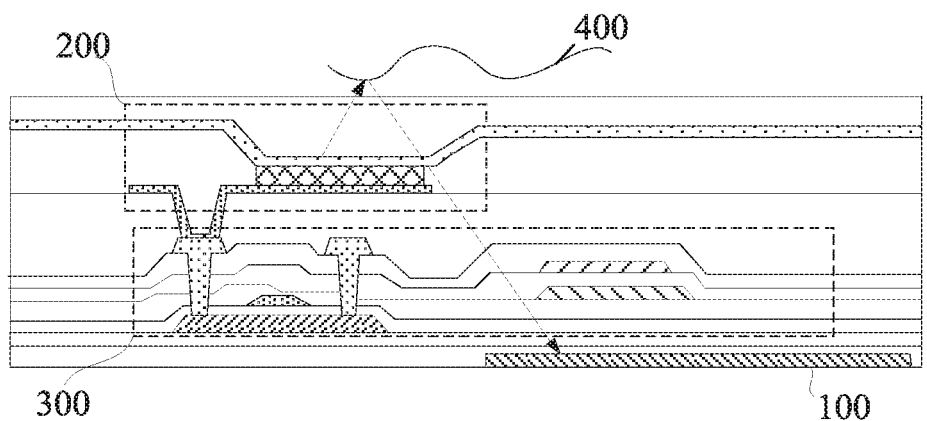
FIG. 14 is a schematic cross-sectional view of a display panel according to an embodiment of the present disclosure.

An embodiment of the present disclosure further provides a display panel. FIG. 14 is a schematic cross-sectional view of a display panel according to an embodiment of the present disclosure. As shown in FIG. 14, the display panel includes the active pixel sensor 100 described above. For example, the display panel may be an organic light-emitting display panel including organic light-emitting elements 200 and pixel driving circuits 300 for driving the organic light-emitting elements 200 to perform display. During fingerprint identification, the organic light-emitting elements 200 of the organic light-emitting display panel may be used as a light source for fingerprint identification, and the light source emits light towards a finger 400 and the light is then reflected by the finger 400 to the active pixel sensor 100, so as to implement fingerprint identification.

Figure 15:
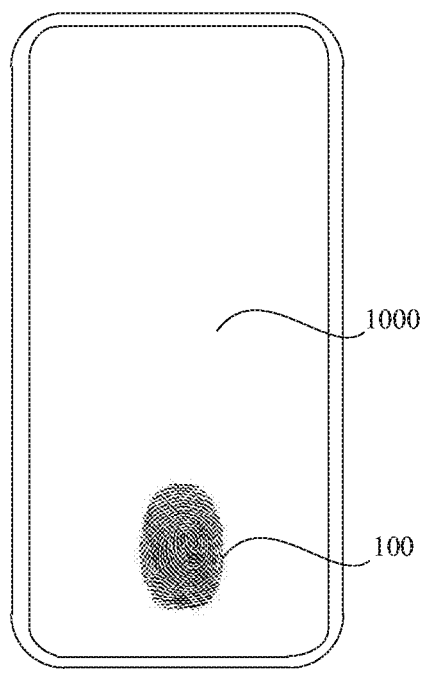
FIG. 15 is a schematic diagram of a display device according to an embodiment of the present disclosure.

An embodiment of the present disclosure further provides a display device. FIG. 15 is a schematic diagram of a display device according to an embodiment of the present disclosure. As shown in FIG. 15, the display device includes the display panel 1000 described above. An active pixel sensor 100 is arranged in the display panel 1000 to enable the display device to have a fingerprint identification function. A structure of the active pixel sensor 100 has been described in detail in the foregoing embodiments, and will not be further described herein. It should be noted that the display device shown in FIG. 15 is merely illustrative, and the display device can be any electronic device having a display function such as a cellphone, a tablet computer, a notebook computer, an electronic paper book, or a television.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. An active pixel sensing circuit structure, comprising:
   a first transistor comprising a control electrode, a first electrode and a second electrode;
   a second transistor comprising a control electrode, a first electrode and a second electrode;
   a third transistor comprising a control electrode, a first electrode and a second electrode;
   a reset control signal line;
   a read control signal line;
   a first voltage signal line;
   a second voltage signal line;
   an output signal line; and
   a photodiode comprising a first electrode,
   wherein the first transistor, the second transistor, the third transistor, the reset control signal line, the read control signal line, the first voltage signal line, the second voltage signal line, and the output signal line are located on a same side of a substrate; and the photodiode is located on a side of the second transistor facing away from the substrate,
   wherein the reset control signal line is electrically connected to the control electrode of the first transistor; the read control signal line is electrically connected to the control electrode of the third transistor; the first voltage signal line is electrically connected to the first electrode of the first transistor; the second voltage signal line is electrically connected to the first electrode of the second transistor; the output signal line is electrically connected to the second electrode of the third transistor; the second electrode of the second transistor is electrically connected to the first electrode of the third transistor; the second electrode of the first transistor, the control electrode of the second transistor, and the first electrode of the photodiode are electrically connected; and the first electrode of the photodiode is electrically connected to the control electrode of the second transistor through a first connection line, and
   wherein the control electrode of the second transistor is located in a first metal layer; the first voltage signal line, the second voltage signal line, and the output signal line are located in a second metal layer; the first connection line is located in a third metal layer; and the first electrode of the photodiode is located in a fourth metal layer, wherein the second metal layer is located on a side of the first metal layer facing away from the substrate, the third metal layer is located on a side of the second metal layer facing away from the substrate, and the fourth metal layer is located on a side of the third metal layer facing away from the first metal layer.

2. The active pixel sensing circuit structure according to claim 1,
   wherein a planarization layer is arranged between the third metal layer and the fourth metal layer, and the planarization layer comprises a first through hole penetrating the planarization layer;
   wherein an interlayer insulation layer is arranged between the third metal layer and the first metal layer, and the interlayer insulation layer comprises a second through hole penetrating the interlayer insulation layer; and
   wherein the first electrode of the photodiode is electrically connected to the first connection line through the first through hole, and the first connection line is electrically connected to the control electrode of the second transistor through the second through hole.

3. The active pixel sensing circuit structure according to claim 2, wherein the planarization layer is an organic layer, and the interlayer insulation layer is an inorganic layer.

4. The active pixel sensing circuit structure according to claim 2, wherein an area of an orthographic projection of the first through hole onto a plane of the substrate is larger than an area of an orthographic projection of the second through hole onto the plane of the substrate.

5. The active pixel sensing circuit structure according to claim 2, wherein an orthographic projection of the first through hole onto a plane of the substrate at least partially overlaps an orthographic projection of the second through hole onto the plane of the substrate.

6. The active pixel sensing circuit structure according to claim 1,
   wherein the reset control signal line and the read control signal line extend in a first direction and are arranged in a second direction; the first voltage signal line, the second voltage signal line, and the output signal line extend in the second direction and are arranged in the first direction; wherein the first direction intersects the second direction; and
   wherein in the first direction, the first transistor, the second transistor, and the third transistor are located between the first voltage signal line and the output signal line; in the second direction, the first transistor, the second transistor, and the third transistor are located between the reset control signal line and the read control signal line; and the second transistor and the third transistor are arranged in the first direction.

7. The active pixel sensing circuit structure according to claim 6, wherein the reset control signal line is located in the first metal layer, and the read control signal line is located in the third metal layer.

8. The active pixel sensing circuit structure according to claim 6, wherein the first transistor and the second transistor are arranged in the second direction.

9. The active pixel sensing circuit structure according to claim 8, wherein an active layer of the first transistor, an active layer of the second transistor, and an active layer of the third transistor extend in the first direction.

10. The active pixel sensing circuit structure according to claim 6, wherein the read control signal line is located in a fifth metal layer, and the fifth metal layer is located between the first metal layer and the third metal layer.

11. The active pixel sensing circuit structure according to claim 10, wherein the reset control signal line is located in the fifth metal layer.

12. The active pixel sensing circuit structure according to claim 1,
wherein a second connection line is provided in the third metal layer; the second connection line is electrically connected to a positive power supply voltage signal input terminal, and the second connection line is electrically connected to one or more of the first voltage signal line and the second voltage signal line.

13. The active pixel sensing circuit structure according to claim 1, wherein the first voltage signal line is reused as the second voltage signal line.

14. The active pixel sensing circuit structure according to claim 1, wherein the photodiode further comprises an active layer and a second electrode that are stacked on a side of the first electrode of the photodiode facing away from the substrate, and wherein the active layer is located between the first electrode of the photodiode and the second electrode of the photodiode.

15. An active pixel sensor, comprising a plurality of active pixel sensing circuit structures arranged in an array, each of the plurality of active pixel sensing circuit structures comprising:
a first transistor comprising a control electrode, a first electrode and a second electrode;
a second transistor comprising a control electrode, a first electrode and a second electrode;
a third transistor comprising a control electrode, a first electrode and a second electrode;
a reset control signal line;
a read control signal line;
a first voltage signal line;
a second voltage signal line;
an output signal line; and
a photodiode comprising a first electrode,
wherein the first transistor, the second transistor, the third transistor, the reset control signal line, the read control signal line, the first voltage signal line, the second voltage signal line, and the output signal line are located on a same side of a substrate; and the photodiode is located on a side of the second transistor facing away from the substrate,
wherein the reset control signal line is electrically connected to the control electrode of the first transistor; the read control signal line is electrically connected to the control electrode of the third transistor; the first voltage signal line is electrically connected to the first electrode of the first transistor; the second voltage signal line is electrically connected to the first electrode of the second transistor; the output signal line is electrically connected to the second electrode of the third transistor; the second electrode of the second transistor is electrically connected to the first electrode of the third transistor; the second electrode of the first transistor, the control electrode of the second transistor, and the first electrode of the photodiode are electrically connected; and the first electrode of the photodiode is electrically connected to the control electrode of the second transistor through a first connection line,
wherein the control electrode of the second transistor is located in a first metal layer; the first voltage signal line, the second voltage signal line, and the output signal line are located in a second metal layer; the first connection line is located in a third metal layer; and the first electrode of the photodiode is located in a fourth metal layer, wherein the second metal layer is located on a side of the first metal layer facing away from the substrate, the third metal layer is located on a side of the second metal layer facing away from the substrate, and the fourth metal layer is located on a side of the third metal layer facing away from the first metal layer,
wherein the reset control signal line and the read control signal line extend in a first direction and are arranged in a second direction; the first voltage signal line, the second voltage signal line, and the output signal line extend in the second direction and are arranged in the first direction; wherein the first direction intersects the second direction, and
wherein in the second direction, the reset control signal line of an $i^{th}$ active pixel sensing circuit structure of the plurality of active pixel sensing circuit structures is reused as the read control signal line of a $(i+1)^{th}$ active pixel sensing circuit structure of the plurality of active pixel sensing circuit structures, where i is an integer larger than or equal to 1.

16. The active pixel sensor according to claim 15,
wherein active pixel sensing circuit structures of the plurality of active pixel sensing circuit structures in a same row are electrically connected to a same reset control signal line and a same read control signal line, and
wherein active pixel sensing circuit structures of the plurality of active pixel sensing circuit structures in a same column are electrically connected to a same first voltage signal line, a same second voltage signal line, and a same output signal line.

17. A display panel, comprising an active pixel sensor, the active pixel sensor comprising a plurality of active pixel sensing circuit structures arranged in an array, each of the plurality of active pixel sensing circuit structures comprising:
a first transistor comprising a control electrode, a first electrode and a second electrode;
a second transistor comprising a control electrode, a first electrode and a second electrode;
a third transistor comprising a control electrode, a first electrode and a second electrode;
a reset control signal line;
a read control signal line;
a first voltage signal line;
a second voltage signal line;
an output signal line; and
a photodiode comprising a first electrode,
wherein the first transistor, the second transistor, the third transistor, the reset control signal line, the read control signal line, the first voltage signal line, the second voltage signal line, and the output signal line are located on a same side of a substrate; and the photodiode is located on a side of the second transistor facing away from the substrate,
wherein the reset control signal line is electrically connected to the control electrode of the first transistor; the read control signal line is electrically connected to the control electrode of the third transistor; the first voltage signal line is electrically connected to the first electrode of the first transistor; the second voltage signal line is electrically connected to the first electrode of the second transistor; the output signal line is electrically connected to the second electrode of the third transistor; the second electrode of the second transistor is electrically connected to the first electrode of the third transistor; the second electrode of the first transistor, the control electrode of the second transistor, and the first electrode of the photodiode are electrically connected; and the first electrode of the photodiode is electrically connected to the control electrode of the second transistor through a first connection line, wherein the control electrode of the second transistor is located in a first metal layer; the first voltage signal line, the second voltage signal line, and the output signal line are located in a second metal layer; the first connection line is located in a third metal layer; and the first electrode of the photodiode is located in a fourth metal layer, wherein the second metal layer is located on a side of the first metal layer facing away from the substrate, the third metal layer is located on a side of the second metal layer facing away from the substrate, and the fourth metal layer is located on a side of the third metal layer facing away from the first metal layer;

wherein the reset control signal line and the read control signal line extend in a first direction and are arranged in a second direction; the first voltage signal line, the second voltage signal line, and the output signal line extend in the second direction and are arranged in the first direction; wherein the first direction intersects the second direction, and wherein in the second direction, the reset control signal line of an $i^{th}$ active pixel sensing circuit structure of the plurality of active pixel sensing circuit structures is reused as the read control signal line of a $(i+1)^{th}$ active pixel sensing circuit structure of the plurality of active pixel sensing circuit structures, where i is an integer larger than or equal to 1.

18. A display device, comprising a display panel, the display panel comprising an active pixel sensor, the active pixel sensor comprising a plurality of active pixel sensing circuit structures arranged in an array, each of the plurality of active pixel sensing circuit structures comprising:
- a first transistor comprising a control electrode, a first electrode and a second electrode;
- a second transistor comprising a control electrode, a first electrode and a second electrode;
- a third transistor comprising a control electrode, a first electrode and a second electrode;
- a reset control signal line;
- a read control signal line;
- a first voltage signal line;
- a second voltage signal line;
- an output signal line; and
- a photodiode comprising a first electrode,
- wherein the first transistor, the second transistor, the third transistor, the reset control signal line, the read control signal line, the first voltage signal line, the second voltage signal line, and the output signal line are located on a same side of a substrate; and the photodiode is located on a side of the second transistor facing away from the substrate, wherein the reset control signal line is electrically connected to the control electrode of the first transistor; the read control signal line is electrically connected to the control electrode of the third transistor; the first voltage signal line is electrically connected to the first electrode of the first transistor; the second voltage signal line is electrically connected to the first electrode of the second transistor; the output signal line is electrically connected to the second electrode of the third transistor; the second electrode of the second transistor is electrically connected to the first electrode of the third transistor; the second electrode of the first transistor, the control electrode of the second transistor, and the first electrode of the photodiode are electrically connected; and the first electrode of the photodiode is electrically connected to the control electrode of the second transistor through a first connection line, wherein the control electrode of the second transistor is located in a first metal layer; the first voltage signal line, the second voltage signal line, and the output signal line are located in a second metal layer; the first connection line is located in a third metal layer; and the first electrode of the photodiode is located in a fourth metal layer, wherein the second metal layer is located on a side of the first metal layer facing away from the substrate, the third metal layer is located on a side of the second metal layer facing away from the substrate, and the fourth metal layer is located on a side of the third metal layer facing away from the first metal layer, wherein the reset control signal line and the read control signal line extend in a first direction and are arranged in a second direction; the first voltage signal line, the second voltage signal line, and the output signal line extend in the second direction and are arranged in the first direction; wherein the first direction intersects the second direction, and wherein in the second direction, the reset control signal line of an $i^{th}$ active pixel sensing circuit structure of the plurality of active pixel sensing circuit structures is reused as the read control signal line of a $(i+1)^{th}$ active pixel sensing circuit structure of the plurality of active pixel sensing circuit structures, where i is an integer larger than or equal to 1.

\* \* \* \* \*